US009454432B2

(12) United States Patent
Alam et al.

(10) Patent No.: US 9,454,432 B2
(45) Date of Patent: *Sep. 27, 2016

(54) METHOD OF READING AND WRITING TO A SPIN TORQUE MAGNETIC RANDOM ACCESS MEMORY WITH ERROR CORRECTING CODE

(71) Applicant: Everspin Technologies, Inc., Chandler, AZ (US)

(72) Inventors: Syed M. Alam, Austin, TX (US); Thomas Andre, Austin, TX (US); Matthew R. Croft, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/737,558

(22) Filed: Jun. 12, 2015

(65) Prior Publication Data

US 2015/0355967 A1 Dec. 10, 2015

Related U.S. Application Data

(63) Continuation of application No. 13/362,805, filed on Jan. 31, 2012, now Pat. No. 9,112,536.

(60) Provisional application No. 61/438,012, filed on Jan. 31, 2011.

(51) Int. Cl.
*G06F 11/10* (2006.01)
*G11C 11/16* (2006.01)
*H03M 13/29* (2006.01)

(52) U.S. Cl.
CPC ....... *G06F 11/1076* (2013.01); *G06F 11/1012* (2013.01); *G06F 11/1048* (2013.01); *G11C 11/1673* (2013.01); *H03M 13/2906* (2013.01)

(58) Field of Classification Search
CPC .......... G06F 11/1048; G06F 11/1012; G06F 11/1076; H03M 13/2906; G11C 11/1673
See application file for complete search history.

(56) References Cited

U.S. PATENT DOCUMENTS

| 5,465,262 | A | 11/1995 | Dell et al. |
|---|---|---|---|
| 7,102,544 | B1 | 9/2006 | Liu |
| 2004/0210814 | A1 | 10/2004 | Cargnoni et al. |
| 2008/0301526 | A1* | 12/2008 | Kohler ................ G06F 11/1044 714/764 |
| 2009/0019344 | A1 | 1/2009 | Yoon et al. |
| 2009/0182918 | A1 | 7/2009 | Hollis |

(Continued)

OTHER PUBLICATIONS

Ass.Prof. Dr. Thamer, "Information theory 4th class in Communications", pp. 1-16, (2010).*

(Continued)

*Primary Examiner* — Albert Decady
*Assistant Examiner* — Kyle Vallecillo
(74) *Attorney, Agent, or Firm* — Lee & Hayes, PLLC

(57) ABSTRACT

A method includes destructively reading bits of a spin torque magnetic random access memory, using error correcting code (ECC) for error correction, and storing inverted or non-inverted data in data-store latches. When a subsequent write operation changes the state of data-store latches, parity calculation and majority detection of the bits are initiated. A majority bit detection and potential inversion of write data minimizes the number of write current pulses. A subsequent write operation received within a specified time or before an original write operation is commenced will cause the majority detection operation to abort.

20 Claims, 9 Drawing Sheets

(56) References Cited

U.S. PATENT DOCUMENTS

2010/0241927 A1* 9/2010 Soma ............... G06F 11/1052 714/760
2010/0332900 A1* 12/2010 Yang ............... G06F 11/106 714/16
2011/0022909 A1 1/2011 Wang et al.

OTHER PUBLICATIONS

Extended European Search Report mailed Feb. 17, 2016 for European patent application No. 12741764.0, 7 pages.

* cited by examiner

METHOD OF READING AND WRITING TO A SPIN TORQUE MAGNETIC RANDOM ACCESS MEMORY WITH ERROR CORRECTING CODE

This application is a continuation of U.S. application Ser. No. 13/362,805 filed Jan. 31, 2012 and entitled "Method Of Reading And Writing To A Spin Torque Magnetic Random Access Memory With Error Correcting Code," which is a non-provisional of and claims benefit of U.S. Provisional Application No. 61/438,012 filed Jan. 31, 2011 and entitled "Majority Detection For Write-Back Power Reduction In DDR Spin-Torque Mram With ECC," the entirety of which is incorporated herein by this reference thereto.

TECHNICAL FIELD

The exemplary embodiments described herein generally relate to integrated magnetic devices and more particularly relate to reading and writing circuitry and methods for magnetoresistive memories.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low (logic "0" state) and high (logic "1" state) electrical resistance states, respectively. Accordingly, a detection of the resistance allows a magnetoresistive memory element, such as an MTJ device, to provide information stored in the magnetic memory element. There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. A reset current pulse will cause the final state to be parallel or logic "0". A set current pulse, in the opposite polarity of reset current pulse, will cause the final state to be antiparallel or logic "1". Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element.

Spin-torque MRAM (ST-MRAM), also known as spin-torque-transfer RAM (STT-RAM), is an emerging memory technology with the potential for non-volatility with unlimited endurance and fast write speeds at much higher density than field-switched MRAM. Since ST-MRAM switching current requirements reduce with decreasing MTJ dimensions, ST-MRAM has the potential to scale nicely at even the most advanced technology nodes. However, increasing variability in MTJ resistance and sustaining relatively high switching currents through bitcell select devices in both current directions can limit the scalability of ST-MRAM. The write current is typically higher in one direction compared to the other, so the select device must be capable of passing the larger of the two currents. In addition, ST-MRAM switching current requirements increase as the write current pulse duration is reduced. Because of this, the smallest ST-MRAM bitcell approach may require relatively long switching times.

Data stored in memory is defined in banks. A rank is a plurality of banks in a first direction (column) and a channel is a plurality of banks in a second direction (row). A process for accessing the memory comprises several clock cycles required for row and column identification and a read or write operation. The bandwidth for the data transfer may comprise a row of many thousands of bits.

Access to a bank in a double data rate (DDR) memory generally includes an ACTIVATE operation, followed by several READ/WRITE operations and a PRECHARGE operation. The ACTIVATE operation opens a row (or page) of typically 1,000 or more bits. The READ/WRITE operation performs the reading or writing of columns, e.g., 128 bits, in the open row (or page). The PRECHARGE operation closes the row.

During the ACTIVATE operation, a page of data is read from the memory array and stored in local data-store latches for subsequent READ and WRITE operations to the local data-store latches. The ACTIVATE operation can be initiated by an ACTIVATE command or any other command that performs the same operation. READ or WRITE operations to the local data-store latches can occur at very high speed, for example every 5 ns. During a PRECHARGE operation, the data from local data-store latches are written back to the memory array, and as a result, that page is considered closed or not accessible without a new ACTIVATE operation. The PRECHARGE operation can be initiated by a PRE-CHARGE or AUTO-PRECHARGE command or any other command that performs the same operation. During the PRECHARGE operation in ST-MRAM, current pulses to write the MTJs corresponding to the open row would be applied to write-back the data from the local data-store latches to ST-MRAM array.

To minimize power consumption during writes to memory array, a known majority detection and data state inversion scheme can be employed. According to a majority detection scheme, a majority state of the data is determined to be a first or second state. Either one of the first or second state may consume more power to write to the memory. If the majority state is determined to be the more power consuming state, all the data bit states may be inverted to the opposite state and written back to the memory. Thus, power consumption during write operation is reduced. However, the majority detection circuit may take some time, for example 5 ns to 10 ns, and would add to the memory write operation time. Majority detection time followed by ST-MRAM write current pulses, e.g., 10 nanoseconds or more, may not be suitable for completion during short PRE-CHARGE operation time.

It is desirable to add error correcting code (ECC) and error correction functionality to ST-MRAM memory to reduce memory error rate. Error correction functionality may further delay the access time to a memory. Therefore, it is desirable to provide a method of reading and writing ST-MRAM memory that employs ECC for reduced error rate, majority detection and inversion scheme for write power reduction, and accordingly manage the memory access delays in a high bandwidth memory system. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A method and apparatus are provided for reading and writing a spin-torque magnetoresistive random access memory with ECC.

A first exemplary embodiment is a method of reading states of bits in an ST-MRAM array, comprising (a) reading data bits, ECC bits, and one or more inversion status bits from the ST-MRAM array; (b) calculating a plurality of parity bits using one of an even or odd number of the data bits; (c) generating corrected data bits and corrected ECC bits using the parity bits and ECC bits; (d) storing the corrected data bits and corrected ECC bits if the inversion status bit is in a first state; (e) inverting the corrected data bits if the inversion status bit is in a second state; (f) storing the inverted corrected data bits and the corrected ECC bits if step (e) is accomplished and the parity bits are calculated using an even number of data bits; (g) inverting the corrected ECC bits if the inversion status bit is in the second state and the parity bits are calculated using an odd number of data bits; and (h) storing the inverted corrected data bits and the inverted corrected ECC bits if steps (e) and (g) are accomplished.

A second exemplary embodiment is a method of reading a plurality of bits in a row in a spin-torque magnetoresistive memory array, the method comprising (a) reading a value of data bits, ECC bits, and inversion status bits in the spin-torque magnetoresistive memory array, the value being either a first state or a second state; (b) storing a value of each of the data bits, ECC bits, and inversion status bits in a plurality of latches; (c) setting the bits in the spin-torque magnetoresistive memory array to a first state; (d) calculating a plurality of parity bits using one of an even or odd number of the data bits; (e) generating corrected data bits and corrected ECC bits from the parity bits and ECC bits; (f) storing the corrected data bits and corrected ECC bits in the latches if the inversion status bit is in a first state; (g) inverting the corrected data bits if the inversion status bit is in a second state; and (h) inverting the corrected ECC bits if the inversion status bit is in the second state and parity bits are calculated using an odd number of data bits; (i) storing the inverted corrected data bits and the corrected ECC bits in the latches if the inversion status bit is in the second state; and (j) writing either the corrected data bits or the inverted corrected data bits, and either the corrected ECC bits or the inverted corrected ECC bits, to the spin-torque magnetoresistive memory array as determined by whether the parity bits were calculated using an even number or an odd number of data bits.

A third exemplary embodiment is a system of reading a plurality of bits in a spin torque magnetoresistive memory array containing data bits, ECC bits, and inversion status bits, the system comprising a plurality of latches; and circuitry configured to (a) read a value of data bits, ECC bits, and inversion status bits in the spin-torque magnetoresistive memory array, the value being either a first state or a second state; (b) store a value of each of the data bits, ECC bits, and inversion status bits in a plurality of latches; (c) calculate a plurality of parity bits using one of an even or odd number of the data bits; (d) generate corrected data bits and corrected ECC bits using the parity bits and ECC bits; (e) store the corrected data bits and corrected ECC bits in the latches if the inversion status bit is in a first state; (f) invert the corrected data bits if the inversion status bit is in a second state; (g) invert the corrected ECC bits if the inversion status bit is in the second state and the parity bits are calculated using an odd number of data bits; (h) store the inverted corrected data bits and the corrected ECC bits in the latches if the inversion status bit is in the second state; and (i) write either the corrected data bits or the inverted corrected data bits, and either the corrected ECC bits or the inverted corrected ECC bits, to the spin-torque magnetoresistive memory array as determined by whether the parity bits were calculated using an even number or an odd number of data bits.

A fourth exemplary embodiment is a system of reading a plurality of bits in a row in a spin-torque magnetoresistive memory array containing data bits, ECC bits, and inversion status bits, the system comprising a triple modular redundancy evaluator coupled to the spin-torque magnetoresistive memory array and configured to (a) receive the inversion status bits; (b) determine an inversion status bit using the majority state of the inversion status bits; (c) calculate inversion status output bits from an inversion status bit; and (d) provide the inversion status output bits to a plurality of data latches; a parity calculator coupled to the spin-torque magnetoresistive memory array and configured to (e) receive the data bits; and (f) calculate parity bits using a plurality of data bits for each parity bit; an error corrector coupled to the spin-torque magnetoresistive memory array and the parity calculator and configured to (g) receive the data bits and the ECC bits from the spin-torque magnetoresistive memory array; (h) receive the parity bits from the parity calculator; and (i) provide the ECC bits to the latches; and a data inversion unit coupled to the error corrector and the triple modular redundancy evaluator, and configured to (j) receive corrected data bits from the error corrector and the inversion status bit from the triple modular redundancy evaluator, and (k) provide one of the corrected data bits or the inverted corrected data bits to the latches.

BRIEF DESCRIPTION OF THE DRAWINGS

The present invention will hereinafter be described in conjunction with the following drawing figures, wherein like numerals denote like elements.

DETAILED DESCRIPTION

Figure 1:
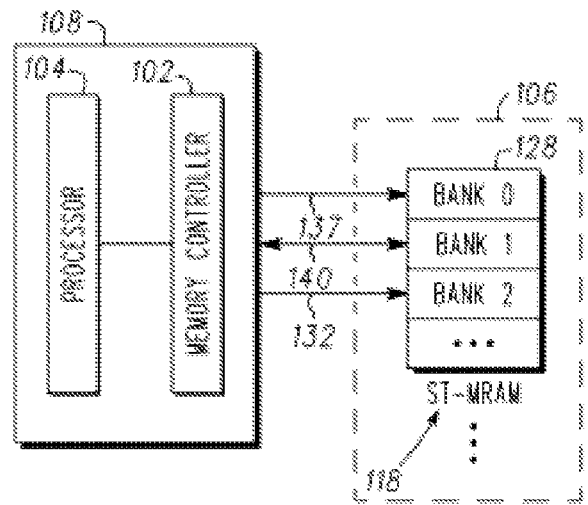
FIG. 1 is a block diagram of a memory interconnection system including a memory controller coupled between a processor and a non-volatile memory that may be used to apply the methods in accordance with the exemplary embodiments.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

A method includes destructively reading bits of a spin torque magnetic random access memory, using error correcting code (ECC) for error correction, and storing inverted or non-inverted data in data-store latches. When a subsequent write operation changes the state of data-store latches, parity calculation and majority detection of the bits are initiated. A majority bit detection and potential inversion of write data minimizes the number of write current pulses. A subsequent write operation received within a specified time or before an original write operation is commenced will cause the majority detection operation to abort.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers may be used to identify like elements according to the different figures that illustrate the various exemplary embodiments.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, resistive, or organic properties corresponding to the data bits. It should be appreciated that the various clock, signal, logic, and functional components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to programming memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

A magnetoresistive random access memory (MRAM) array includes write current drivers and sense-amplifiers positioned near a plurality of magnetoresistive bits. A write, or program, operation begins when a current of either one of the two different and opposite polarities, set or reset, is applied through the magnetic storage element, e.g., MTJ. Such write mechanism is employed in spin torque transfer (STT) or spin torque (ST) MRAM. The spin-torque effect is known to those skilled in the art. Briefly, a current becomes spin-polarized after the electrons pass through the first magnetic layer in a magnetic/non-magnetic/magnetic trilayer structure, where the first magnetic layer is substantially more stable than the second magnetic layer. The higher stability of the first layer compared to the second layer may be determined by one or more of several factors including: a larger magnetic moment due to thickness or magnetization, coupling to an adjacent antiferromagnetic layer, coupling to another ferromagnetic layer as in a SAF structure, or a high magnetic anisotropy. The spin-polarized electrons cross the nonmagnetic spacer and then, through conservation of spin angular momentum, exert a spin torque on the second magnetic layer that causes precession of the its magnetic moment and switching to a different stable magnetic state if the current is in the proper direction. When net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided the magnitude of the current is above a second critical current value. Switching in this reverse direction involves a fraction of the electrons reflecting from the interface between the spacer and the first magnetic layer and traveling back across the nonmagnetic spacer to interacting with the second magnetic layer.

Magnetoresistance is the property of a material to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel.

FIG. 1 is a block diagram of an exemplary memory system 100 including a memory controller 102 that performs data transfer between a processor 104 and the memory 106. The memory controller 102 and the processor 104 may reside on the same chip 108, or they may reside on separate chips (not shown). The memory 106 comprises a non-volatile memory 118 using magnetic tunnel junctions, preferably ST-MRAM, for data storage. The non-volatile memory 118 comprises a plurality of non-volatile memory banks 128.

A chip select (CS) line 132 provides a CS signal from the memory controller 102 to the non-volatile memory 118. An address bus 137 and a data line 140 couples the memory controller 102 to the non-volatile memory 118. Other control and clock signals may exist between the memory controller 102 and non-volatile memory 118 that are not shown in FIG. 1. Furthermore, an address bus 137 and a data line 140 may include multiple lines or bits.

In operation, an ACTIVATE operation for an address can be initiated in non-volatile memory 118. Subsequently, the memory controller 102 initiates READ or WRITE operations in the non-volatile memory 118. The data from non-volatile memory 118 is read after the non-volatile memory ACTIVATE operation is complete.

Figure 2:
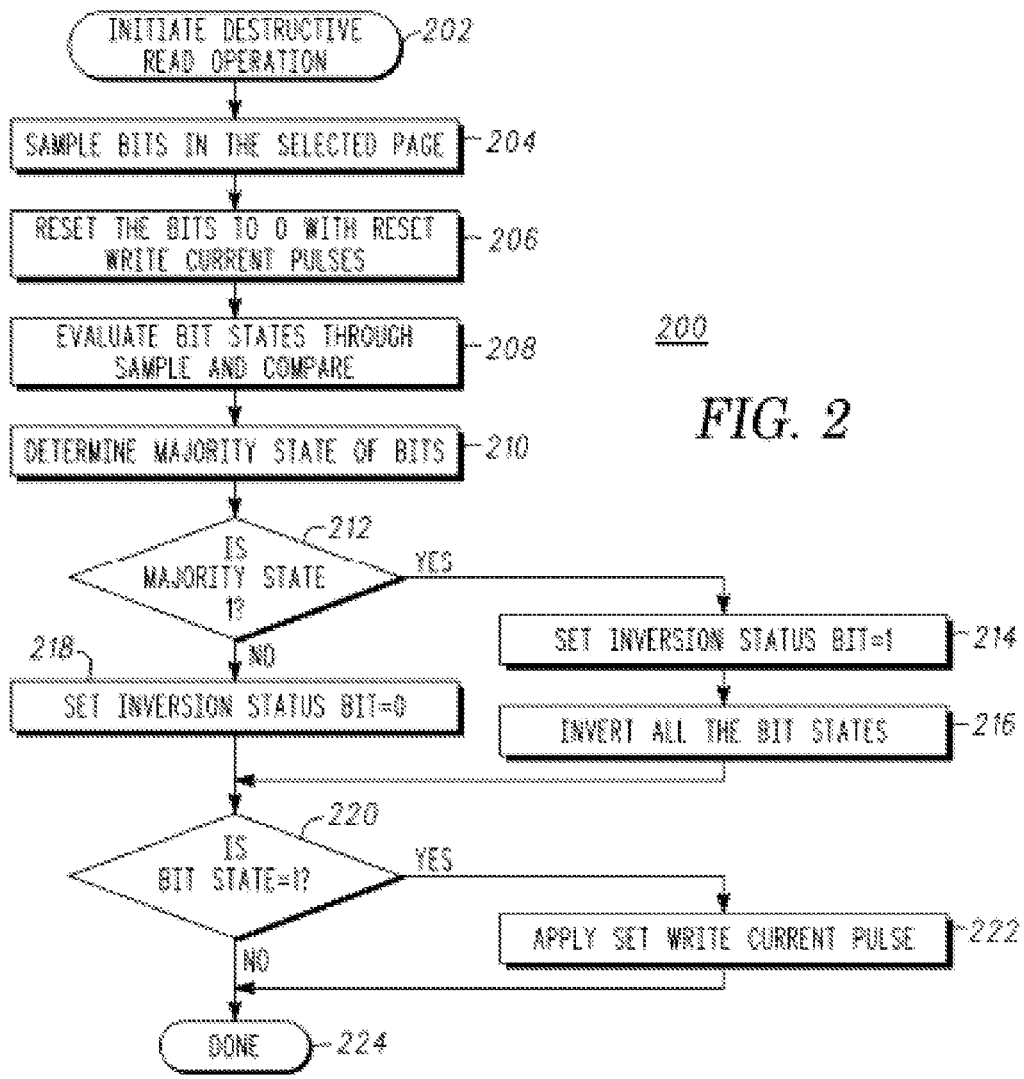
FIG. 2 is a flow chart of steps for a destructive read with majority detection and write-back to ST-MRAM in accordance with a first exemplary embodiment.

The ACTIVATE operation in DDR ST-MRAM initiates a destructive read where addressed data in the memory array is reset to 0 or equivalently logic state "0". FIG. 2 is a flow chart that illustrates the first exemplary embodiment of a destructive read operation with majority detection and write-back process 200 of one page (or equivalently one row) of data comprising multiple bits. The process 200 is initiated at the beginning of a destructive read operation 202. A sampling 204 of multiple magnetic bits of the non-volatile memory 118 provides and stores sampled voltages associated with each bit. An exemplary sample operation is applying a desired voltage, Vbit, across a bit; converting the resulting current through the bit into a voltage, Vsample; and storing Vsample into a capacitor. Reset write current pulses are applied 206 to set all the bits in the selected page to 0. The bit states are evaluated 208 by re-sampling voltages after step 206 is completed and comparing the re-sampled voltages with the sampled voltages from step 204 for each bit. An exemplary re-sample and evaluate operation is applying the same desired voltage, Vbit, from step 204 across the bit; comparing the resulting current through the bit added with an offset current with the current due to Vsample from step 204 to generate a voltage, Veval; and comparing Veval with Vsample from step 204 to evaluate the bit state. The bit states are thus evaluated to be either 0 or 1 for each bit. A majority state of the bits is determined 210. If 212 the majority state is 1, i.e., the number bits evaluated to 1 is higher than the number of bits evaluated to 0, an inversion status bit is set 214 to 1 for the selected page, and all the bit states are inverted 216, and the process proceeds to step 220. If 212 the majority state is not 1, an inversion status bit is set to 0 for the selected page 218 and the process proceeds to step 220. For each bit in the page, if 220 the bit state is 1, a set write current pulse is applied 222 to set the bit to 1 thus performing a write-back to restore the bit state in accordance with the inversion status bit set in either 214 or 218. The process 200 is complete 224 after 222. For each bit in the page, if 220 the bit state is 0, no set write current pulse is needed and the process 200 is complete 224.

The first exemplary embodiment in FIG. 2 illustrates using majority detection and page inversion scheme to minimize the number of set write current pulses during the write-back phase, thereby reducing power consumption. An inversion status bit for a page tracks if the page bit states are inverted or not. While it is not shown in FIG. 2, an inversion status with multiple bits may be implemented, for example, three bits where the majority state of the three bits determines the inversion status. The first exemplary embodiment in FIG. 2 illustrates destructive read where the bit is reset to 0 during the destruction phase. A destructive read may also be implemented where the bit is set to 1 during the destruction phase. In such an alternate embodiment, the first exemplary embodiment in FIG. 2 would be modified to set all the bits to 1 in step 206, and step 212 would check for majority state of 0 instead of 1. Step 220 would check for a bit state of 0, and if 0, would apply 222 a reset write current pulse.

Due to a short timing duration constraint of an ACTIVATE operation, not all the steps in FIG. 2 may be performed during the ACTIVATE operation. Steps 202 to 208 of FIG. 2 may be performed during an ACTIVATE operation at the end of which evaluated bit states from 208 are stored in local-data store latches. READ and WRITE operations subsequent to an ACTIVATE operation would be performed to the local data-store latches instead of ST-MRAM array. Whenever a WRITE operation changes data in the local data-store latches, steps 212, 214, 218, and 216 in FIG. 2 are performed. Steps 220, 222, and 224 are performed during a PRECHARGE operation. Thus, data is written to the ST-MRAM array during the PRECHARGE operation.

Figure 3:
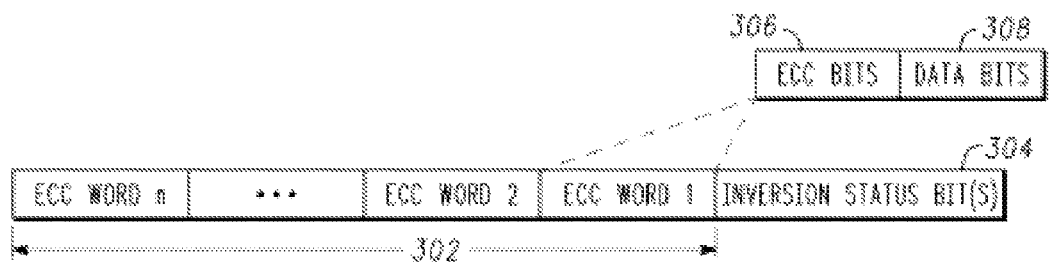
FIG. 3 is a diagram of an organization of words in a row or page of a bank of non-volatile memory.

Referring to FIG. 3, a known method of organizing a page of bits into multiple error correcting code (ECC) words includes a plurality of ECC words 302 from 1 to n and a word of inversion status bits 304. Each ECC word 302 comprises a plurality of ECC or parity bits 306 and a plurality of data bits 308.

Two exemplary embodiments will be described for datapath operation with ECC while reading an ST-MRAM array. The first embodiment, the block diagram of FIG. 4 and the flow chart of FIG. 5, includes ECC parity calculations such that each parity bit is calculated using an even number of data bit inputs, the majority detection scheme using only data bits and no ECC bit, and ST-MRAM array always storing non-inverted ECC bits. The second embodiment, the block diagram of FIG. 6 and the flow chart of FIG. 7, includes ECC parity calculations such that each parity bit is calculated using an odd number of data bit inputs so that error correction can be performed regardless of the inversion status bit, and the majority detection scheme using ECC bits in addition to data bits. It should be noted that these embodiments may be implemented with circuitry (FIGS. 4, 6) fabricated in memory 106, or the chip 108 for example, or with software within the processor 104 or memory controller 102.

Figure 4:
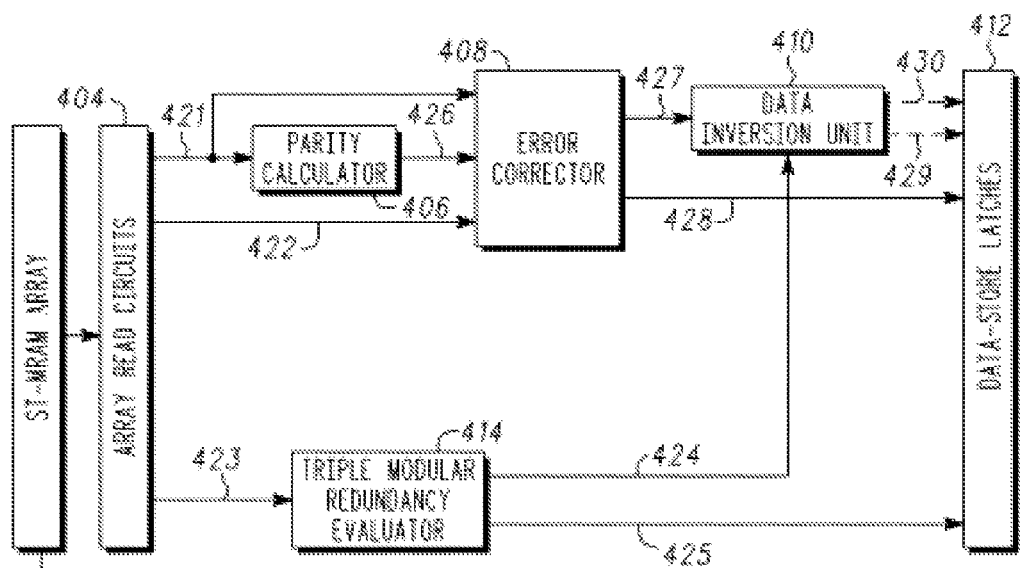
FIG. 4 is a block diagram of circuitry for datapath operations involving reading ST-MRAM array during an ACTIVATE operation in accordance with a first exemplary embodiment.

Referring to FIG. 4, the circuitry 400 for datapath operation of the first embodiment includes an ST-MRAM array 402, array read circuits 404, a parity calculator 406, an error corrector 408, a data inversion unit 410, data-store latches 412, and a triple modular redundancy evaluator 414.

In operation (referring to FIG. 4 and FIG. 5), data bits 421, ECC bits 422, and inversion status bits 423 are read 502 from the ST-MRAM array 402 by the array read circuits 404. Subsequent to step 502, triple modular redundancy is applied 504 to the inversion status bits 423 for determining an inversion status bit 424 and, in step 506, calculated inversion status bits 425 are provided to the data-store latches 412. An example operation of triple modular redundancy evaluator 414 is using the majority state of a 3-bit inversion status bits 423 to determine a single bit inversion status bit 424 and a 3-bit calculated inversion status bits 425 that is generated by placing the same 1-bit inversion status bit 424 on each bit of the 3-bit inversion status bits 425.

In step 508, parity bits 426 are calculated by the parity calculator 406 using an even number of data bits 421 for each of the parity bits 426. Corrected data bits 427 and corrected ECC bits 428 are generated 510 from the calculated parity bits 426, data bits 421, and ECC bits 422. If, in step 512, the inversion status bit is a "1", the corrected data bits 427 are inverted 516 by the data inversion unit 410 followed by inverted corrected data bits 429, corrected ECC bits 428, and calculated inversion status bits 425 being stored 518 in the data-store latches 412. If 512 the inversion status bit is not a "1", the data inversion unit 410 passes corrected data bits 427 without any inversion to corrected data bits 430, wherein the corrected data bits 430, calculated inversion status bits 425, and corrected ECC bits 428 are stored in step 514. In summary, if the inversion status bit is a "1", the inverted corrected data bits 429, corrected ECC bits 428, and calculated inversion status bits 425 are stored in the data-store latches 412, and if the inversion bit is not a "1", the (non-inverted) corrected data bits 430, corrected ECC bits 428, and calculated inversion status bits 425 are stored in the data-store latches 412.

Figure 5:
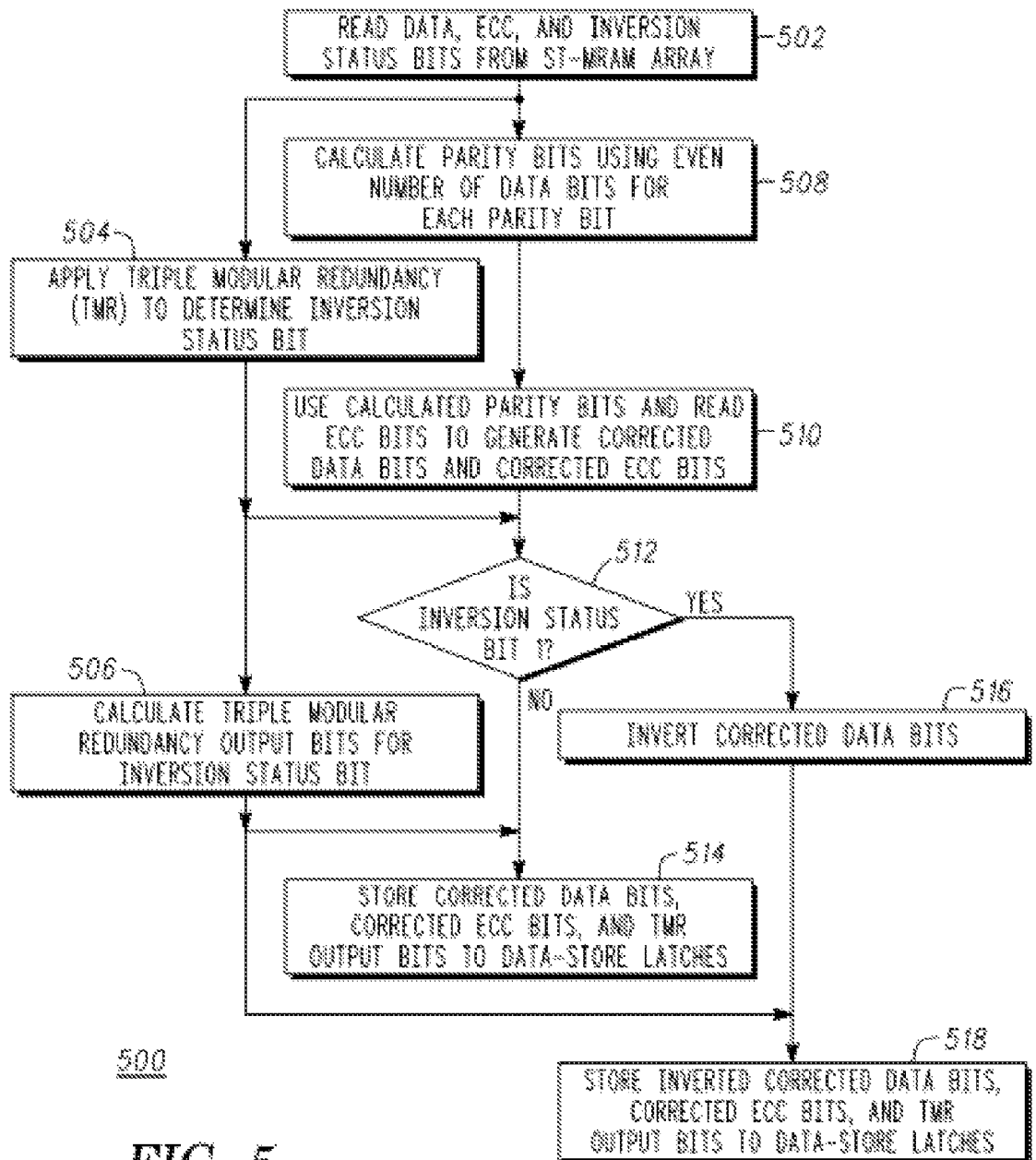
FIG. 5 is a flow chart of the steps for datapath operations involving reading ST-MRAM array during an ACTIVATE operation in accordance with the first exemplary embodiment.

The benefit of the first embodiment described in block diagram FIG. 4 and flow-chart FIG. 5 is that parity calculation in step 508 and error correction in step 510 do not require any knowledge of inversion status bit (memory data bits are inverted or not) due to using an even number of data bits to calculate each parity bit. Using an even number of data bits to calculate each parity bit allows parity calculation and error correction using data bits 421 and ECC bits 422 as long as ECC bits 422 are never inverted and data bits 421 are in either inverted or non-inverted. Data bits 421 read from ST-MRAM array may be in original or inverted state which is determined by the triple modular redundancy evaluator 414 in step 504. Step 504 is executed in parallel to steps 508 and 510 subsequent to step 502. Such parallel operations reduce the datapath delay.

Figure 6:
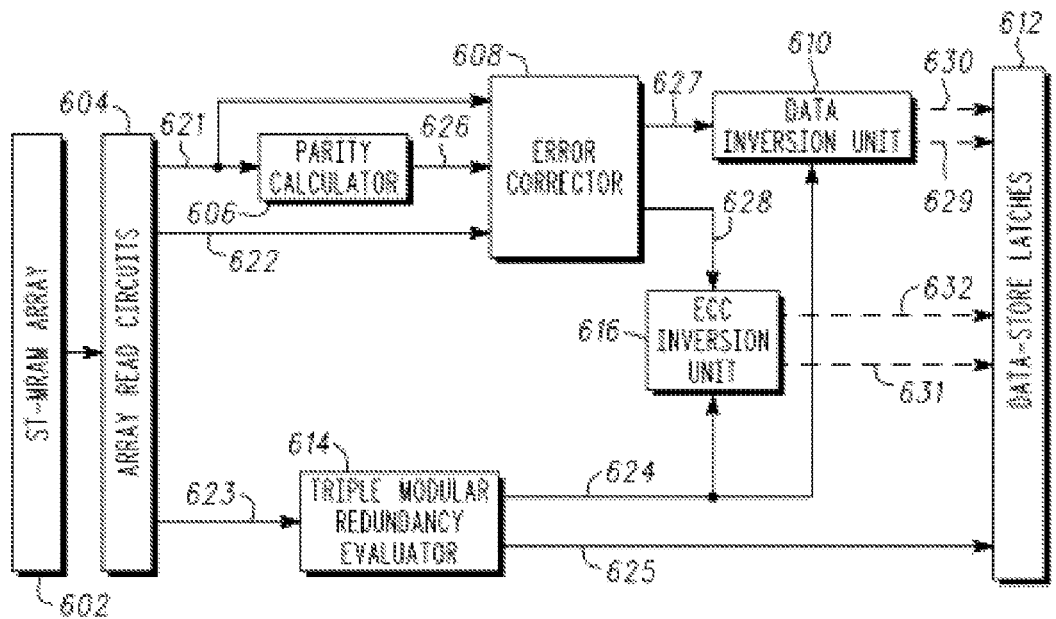
FIG. 6 is a block diagram of circuitry for datapath operations involving reading ST-MRAM array during an ACTIVATE operation in accordance with a second exemplary embodiment.

Referring to FIG. 6, the circuitry 600 for datapath operation of the second embodiment includes an ST-MRAM array 602, array read circuits 604, a parity calculator 606, an error corrector 608, a data inversion unit 610, data-store latches 612, a triple modular redundancy evaluator 614, and an ECC inversion unit 616.

In operation (FIG. 7), data bits 621, ECC bits 622, and inversion status bits 623 are read 702 from the ST-MRAM array 602 by the array read circuits 604. Triple modular redundancy is applied 704 to the inversion status bits 623 for determining an inversion status bit 624, and in step 706, calculated inversion status bits 625 are provide to the data-store latches 612.

In step 708 subsequent to 702, parity bits 626 are calculated by the parity calculator 606 using an odd number of data bits 621 for each of the parity bits 626. Corrected data bits 627 and corrected ECC bits 628 are generated 710 from the calculated parity bits 626, data bits 621, and ECC bits 622. If, in step 712, the inversion status bit is a "1", the corrected data bits 627 and the corrected ECC bits 628 are inverted 716 by the data inversion unit 610 and the ECC inversion unit 616, respectively, as inverted corrected data bits 629 and inverted ECC bits 631 are stored 718 in the data-store latches 612 along with storing calculated inversion status bits 625. If the inversion status bit is not a "1", the data inversion unit 610 passes corrected data bits 627 without any inversion to corrected data bits 630; the ECC inversion unit 616 passes corrected ECC bits 628 without any inversion to corrected ECC bits 632; the corrected data bits 630, corrected ECC bits 632, and calculated inversion status bits 625 are stored in data-store latches in step 714. In summary, if the inversion bit is a "1", the inverted corrected data bits 629, inverted corrected ECC bits 631, and calculated inversion status bits 625 are stored in the data-store latches 612, and if the inversion bit is not a "1", the (non-inverted) corrected data bits 630, and (non-inverted) corrected ECC bits 632, calculated inversion status bits 625 are stored in the data-store latches 612.

Figure 7:
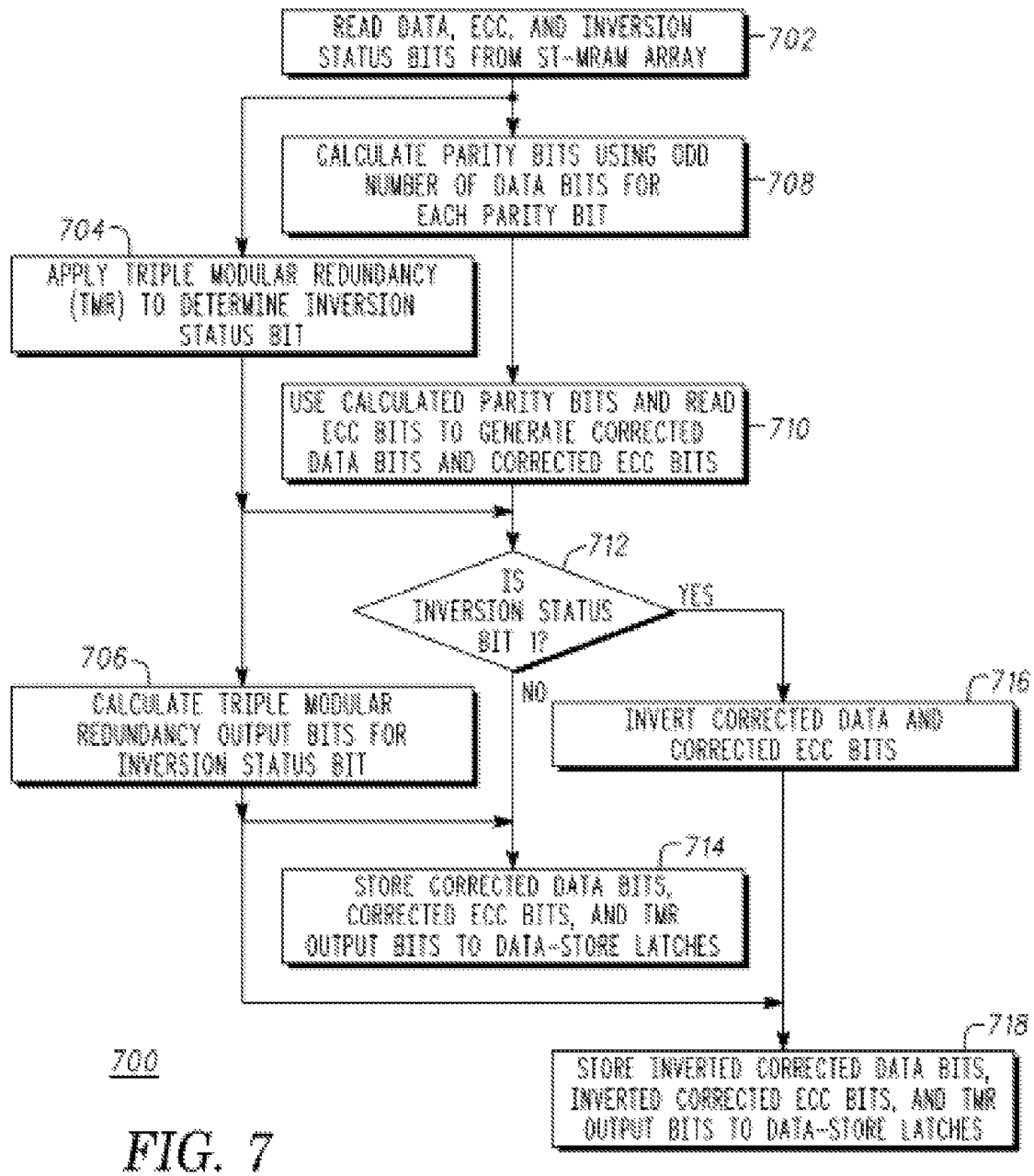
FIG. 7 is a flow chart of the steps for datapath operations involving reading ST-MRAM array during an ACTIVATE operation in accordance with the second exemplary embodiment.

The benefit of the second embodiment described in block diagram FIG. 6 and flow-chart FIG. 7 is that the parity calculation in step 708 and error correction in step 710 do not require any knowledge of inversion status bit (memory data and ECC bits are inverted or not) due to using an odd number of data bits to calculate each parity bit. Using an odd number of data bits to calculate each parity bit allows parity calculation and error correction using data bits 621 and ECC bits 622 as long as both data and ECC bits are inverted or both data and ECC bits are non-inverted in the memory. Data bits 621 and ECC bits 622 read from ST-MRAM array may be in original (non-inverted) or inverted state which is determined by the triple modular redundancy evaluator 614 in step 704. Step 704 is executed in parallel to steps 708 and 710 subsequent to step 702. Such parallel operations reduce the datapath delay.

The circuitry in block diagrams FIG. 4 and FIG. 6 can be implemented in multiple ways for example with digital gates NAND, AND, NOR, XOR, OR, complex gates, precharge-evaluate logic, dynamic circuits, state-machines, flip-flops, latches, as well as analog circuits such as sense amplifiers and comparators. The store operation to data-store latches may comprise of loading a flip-flop with a rising or falling edge of a clock or updating a latch using a level of a control signal.

Figure 8:
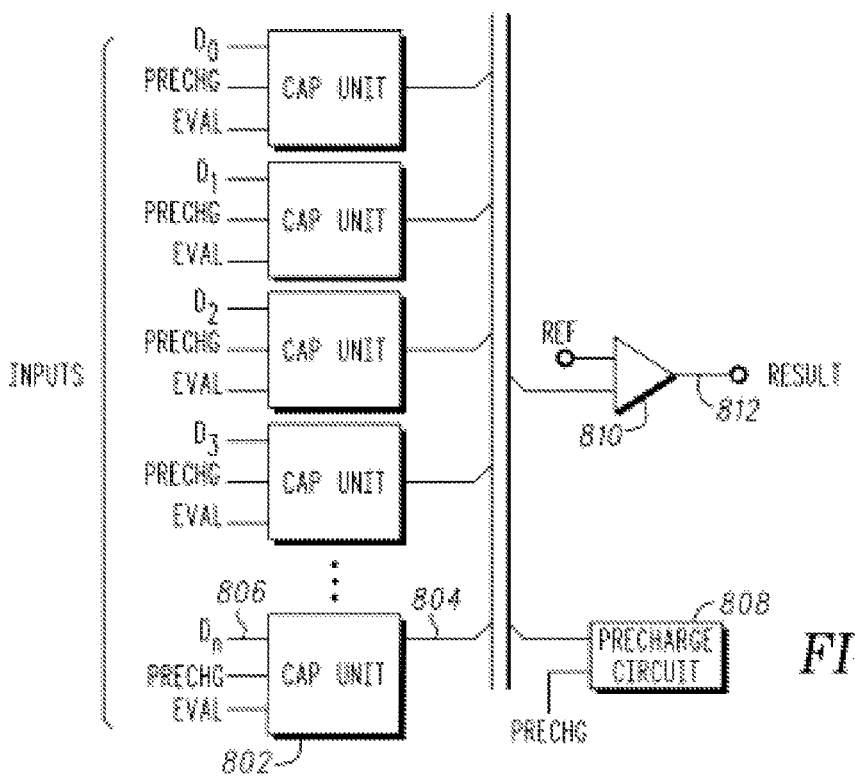
FIG. 8 is a block diagram of a majority detection circuit.

It is evident from the two exemplary embodiments for datapath operation with ECC while reading an ST-MRAM array that either data bits (FIG. 4 and FIG. 5) or both data and ECC bits (FIG. 6 and FIG. 7) in ST-MRAM array can be inverted or non-inverted state. This is because a majority detection and inversion scheme is employed during writing new data to ST-MRAM array to reduce write power consumption. FIG. 8 shows a block diagram of a majority detection circuit that determines the majority state of a number of bits. Referring to FIG. 8, a plurality of capacitive units 802 provide a common output on the line 804, each capacitive unit 802 being responsive to one of a plurality of data and ECC, or data inputs 806. Each capacitive unit 802 also receives signal inputs Prechg and Eval. The common output on line 804 is provided to a pre-charging circuit 808 and is compared with a reference voltage by a differential amplifier 810 to provide a result 812. The pre-charging circuit 808 receives an input Prechg. Each capacitive unit 802 (FIG. 9) includes an inverter 902 responsive to one of the data and ECC, or one of the data inputs 806 for providing an output to a pre-charge switch 904. The pre-charge switch 904 can be implemented using a single transistor, as in a pass-gate, or a transfer gate. The pre-charge switch 904 receives the input signal Prechg. A capacitor 906 is coupled to a node 908 between the pre-charge switch 904 and an evaluation switch 910. The evaluation switch 910 can be implemented using a single transistor as in a pass-gate, or a transfer gate. The evaluation switch 910 receives the input signal Eval.

Figure 9:
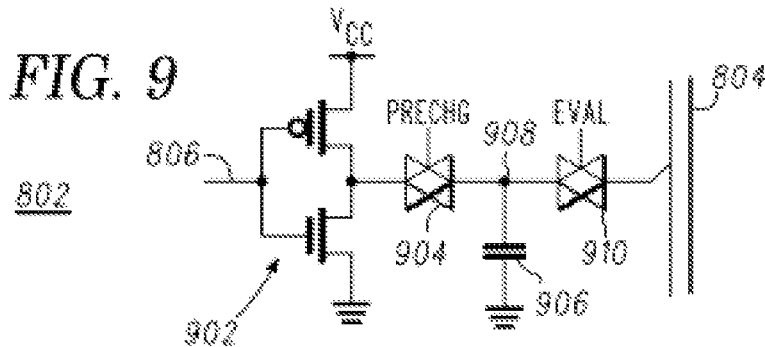
FIG. 9 is a circuit diagram for each of a capacitive unit of FIG. 8.

In operation of the majority detection circuit in FIG. 8 and FIG. 9, a Prechg high pulse is first applied while Eval signal is low. During this time, a plurality of capacitor 906 in a plurality of capacitive units 802 is charged to a high voltage if input 806 is high, or is discharged to a low voltage if input 806 is low. During this same time, the pre-charging circuit 808 further charges the common output line 804 to the same reference voltage of the differential amplifier 810. Subsequently, the Eval signal pulses high while Prechg signal is low during which charge sharing between a plurality of capacitor 906 and common line 804 occurs. If the common line 804 voltage is lower than the reference voltage of the differential amplifier 810, the result 812 is high to indicate a majority state of 1 in the plurality of data and ECC, or data input bits 806. If the common line 804 voltage is higher than the reference voltage of the differential amplifier 810, the result 812 is low to indicate a majority state of 0 in the plurality of data and ECC, or data input bits 806. For simplicity, only Prechg and Eval signals are shown in FIG. 8 and FIG. 9 to describe the main function. Other control signals may exist, for example to clock the differential amplifier circuit 810. Furthermore, an equalization switch can be added between the common line 804 and the reference voltage of the differential amplifier 810 (not shown in FIG. 8) such that the common line 804 and the reference voltage of the differential amplifier 810 are equalized and charged to the same potential by the pre-charging circuit 808 while the Prechg signal is high.

Figure 10:
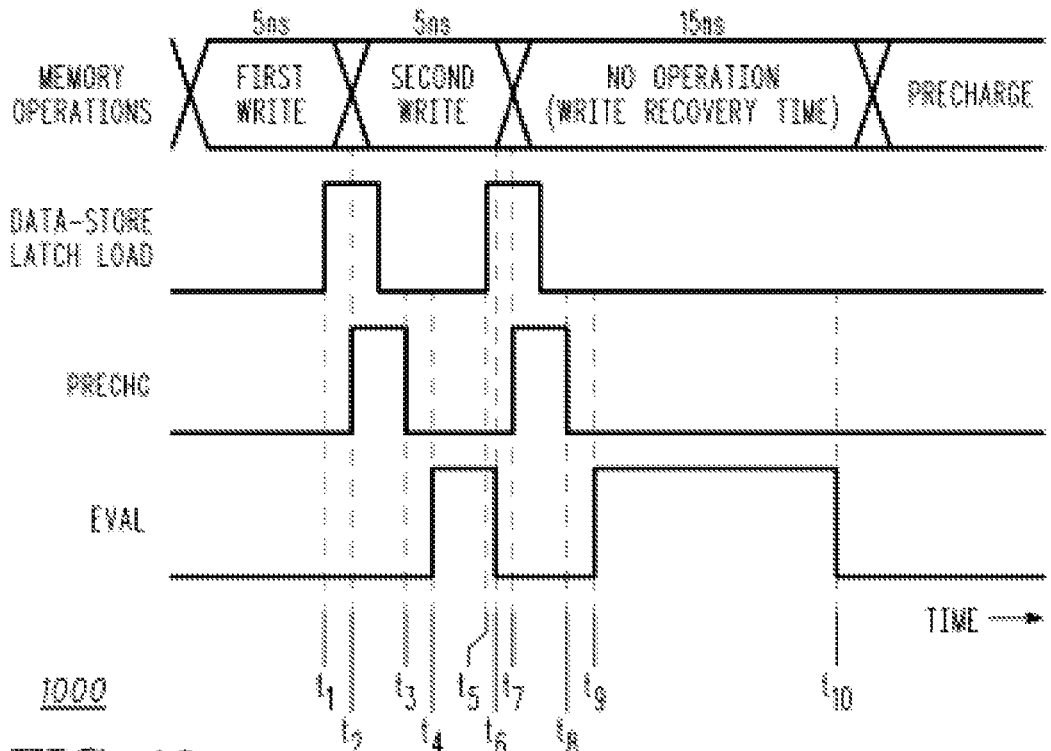
FIG. 10 is a timing diagram of memory operations for using majority detection circuit in accordance with the first and second exemplary embodiments.

FIG. 10 is a timing diagram illustrating an example sequence of memory operations for using majority detection circuit in accordance with the first and second exemplary embodiments. During an ACTIVATE operation, ST-MRAM array is read and data-store latches are loaded with either inverted or non-inverted corrected data and non-inverted corrected ECC bits from ST-MRAM array in the first exemplary embodiment, or inverted corrected data and inverted corrected ECC bits or non-inverted corrected data and non-inverted corrected ECC bits from ST-MRAM array in the second exemplary embodiment. In either one of the two embodiments, the ACTIVATE operation is followed by a sequence of READ/WRITE operations to the data-store latches. Referring to FIG. 10, a first WRITE operation loads the data-store latches or a portion of data-store latches with new states of data bits at time t1. Subsequently, at time t2, the majority detection circuit's Prechg pulse high signal is asserted. As an example, the Prechg pulse high time is 3 ns after which at time t3, Prechg high goes low, and at time t4 majority detection circuit's Eval signal is asserted high. A second WRITE operation can be initiated subsequent to the first WRITE operation at a fast interval, for example 5 ns. The data-store latches are loaded at time t5 with data for the second WRITE operation, subsequent to which at time t6, majority detection circuit Eval signal goes low.

The majority detection circuit evaluation operation may not be completed during the short time duration from t4 to t6. This activity is referred to as aborting the majority detection. The majority detection circuit's operation sequence is initiated at time t7 in response to the second WRITE operation. If the second WRITE operation is the last WRITE operation, a write recovery time, for example of 15 ns, is available according to the DDR memory specification. The majority detection operation sequence in response to the second and last WRITE operation continues into the write recovery time and completes, at time t10, without any abort. An example majority detection circuit's Eval high time is 10 ns. After the majority detection circuit operation is complete, new data bit states are ready for a PRECHARGE memory operation during which new data states will be written to ST-MRAM array using write current pulses.

FIG. 10 illustrates the majority detection circuit operation in response to WRITE operations that has the majority detection circuit operation abort feature. In response to a WRITE operation, new ECC calculations also occur which is illustrated next using the flow charts of FIG. 11 and FIG. 12 in accordance with the first and second exemplary embodiments, respectively.

Figure 11:
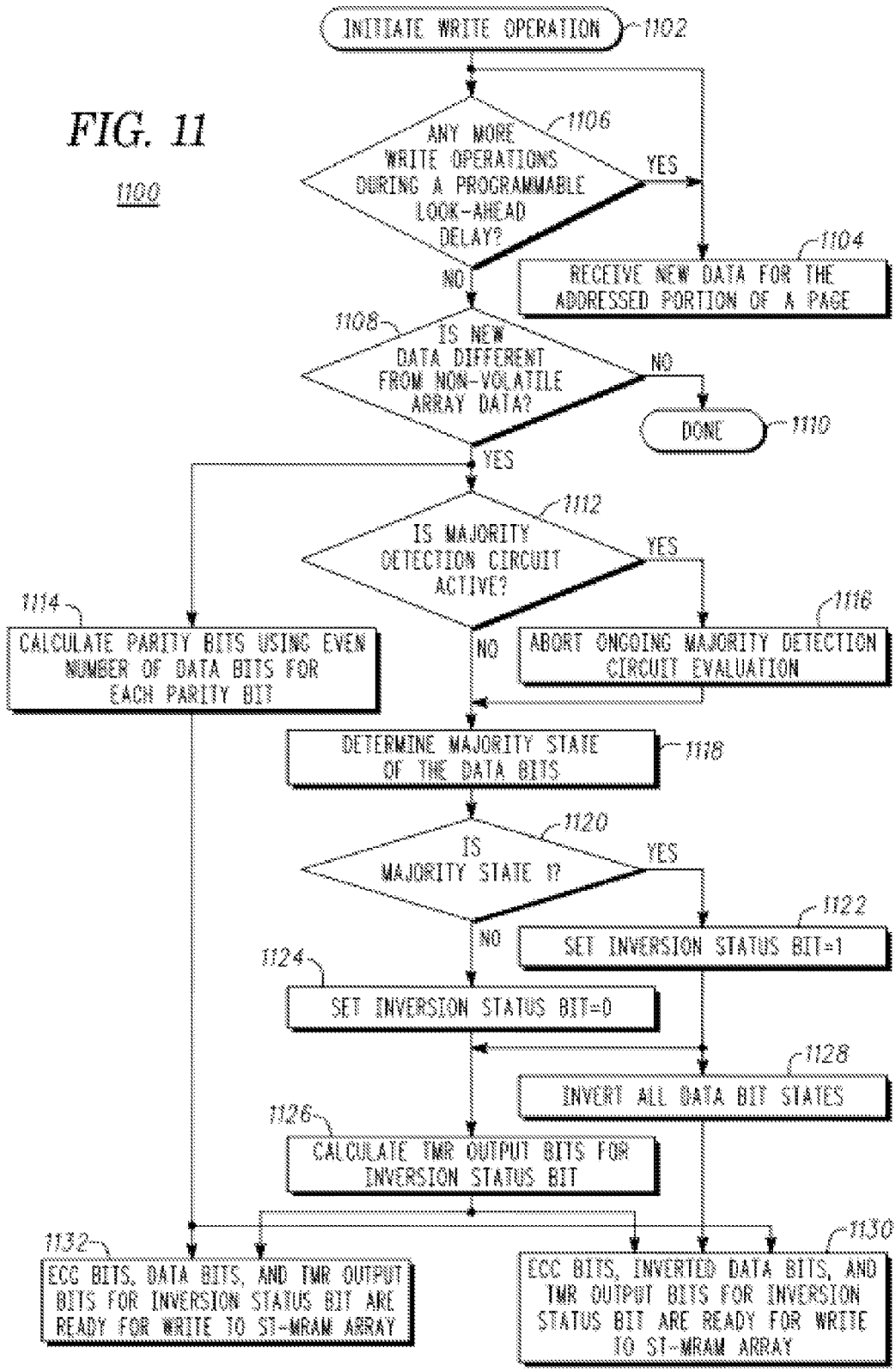
FIG. 11 is a flow chart of the steps occurring in response to a WRITE operation in accordance with the first exemplary embodiment.

FIG. 11 is a flow chart of the steps of process 1100 occurring in response to a WRITE operation in accordance with the first exemplary embodiment. A write operation is initiated 1102, and polling for any more WRITE operation during a programmable look-ahead delay occurs 1106, and in parallel in step 1104, new data for the addressed portion of a page is received. If 1106, any more WRITE operation occurs during a programmable look-ahead delay, new data from that WRITE operation is received 1104 for the addressed portion of a page. If no more WRITE operation during a programmable look-ahead delay occurs 1106, the process 1100 proceeds to 1108. If new data is not different from non-volatile memory array data 1108, the process 1100 ends at 1110. If new data is different from non-volatile memory array data 1108, parity bits are calculated 1114 using an even number of data bits for each parity bit, and in parallel, whether majority detection circuit is active or not is determined 1112. If the majority detection circuit is active 1112, ongoing majority detection circuit evaluation is aborted 1116, followed by determining 1118 the majority state of the data bits. If in step 1112, the majority detection circuit is not active, process 1100 directly steps to determining majority state of the data bits in 1118. If 1120, majority state is 1, an inversion status bit is set 1122 to 1. If in step 1120, the majority state is not 1, an inversion status bit is set 1124 to 0, following which triple modular redundancy (TMR) output bits are calculated for the inversion status bit in 1126. Subsequent to step 1122, all the data bit states are inverted 1128 and TMR output bits are calculated for the inversion status bit 1126. Subsequent to steps 1126, 1128, and 1114, ECC bits, inverted data bits, and TMR output bits for inversion status bit of 1 are ready for write to ST-MRAM array in 1130. Subsequent to steps 1126 and 1114, ECC bits, (non-inverted) data bits, and TMR output bits for inversion status bit of 0 are ready for write to ST-MRAM array in 1132. Note that the process 1100 never inverts ECC bits for write to ST-MRAM array, ECC bits are calculated using an even number of data bits for each parity, and the majority detection includes only data bits and no ECC bits. The process 1100 in response to a WRITE operation is in accordance with the first embodiment of datapath operations in FIG. 4 and FIG. 5 during read. The process 1100 prepares data and ECC bits for write to the ST-MRAM array. The actual write operations using write current pulses to the ST-MRAM array may occur subsequently or during a PRECHARGE operation.

Figure 12A:
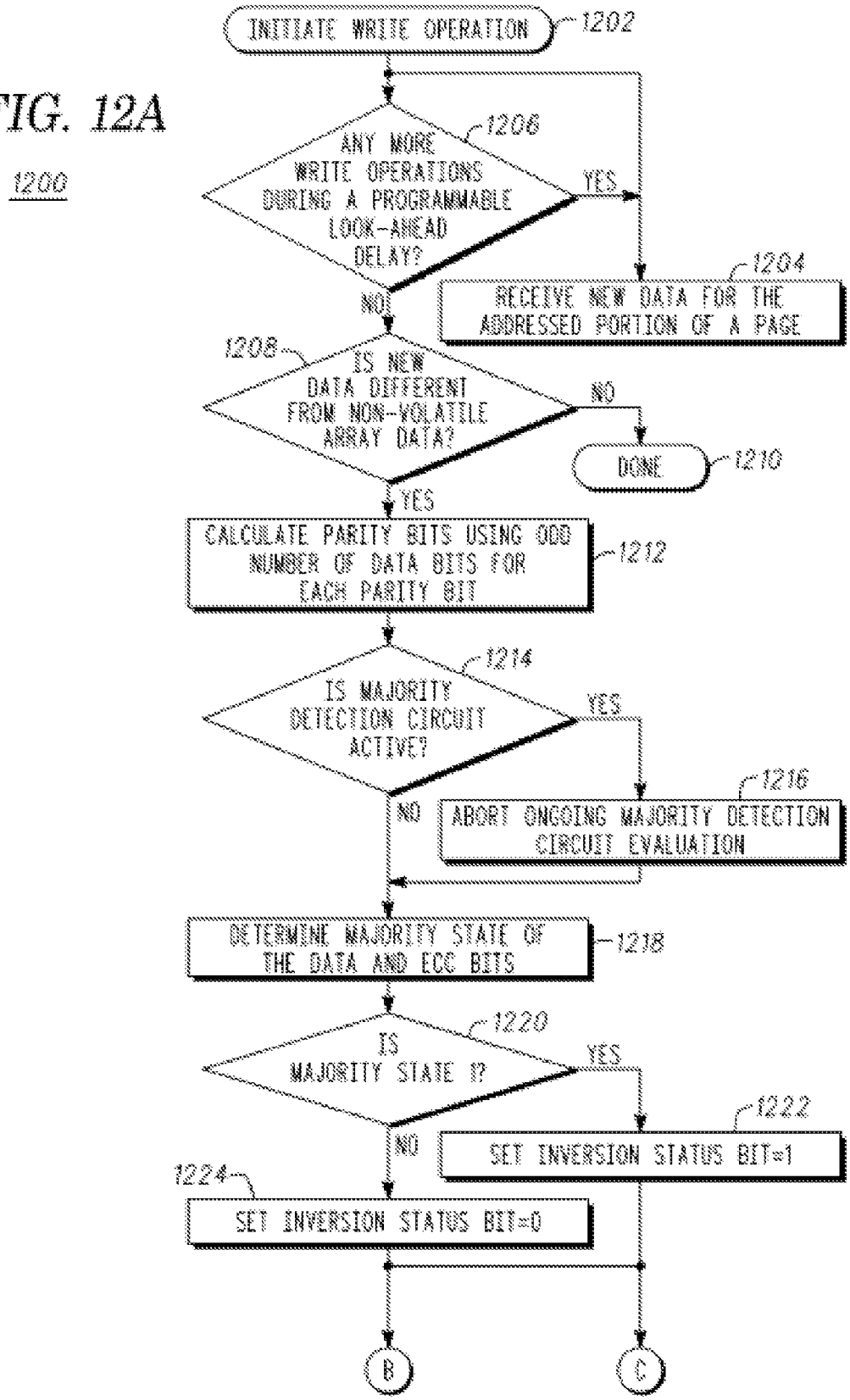
FIG. 12(a) is a flow chart of the steps occurring in response to a WRITE operation in accordance with the second exemplary embodiment.
Figure 12B:
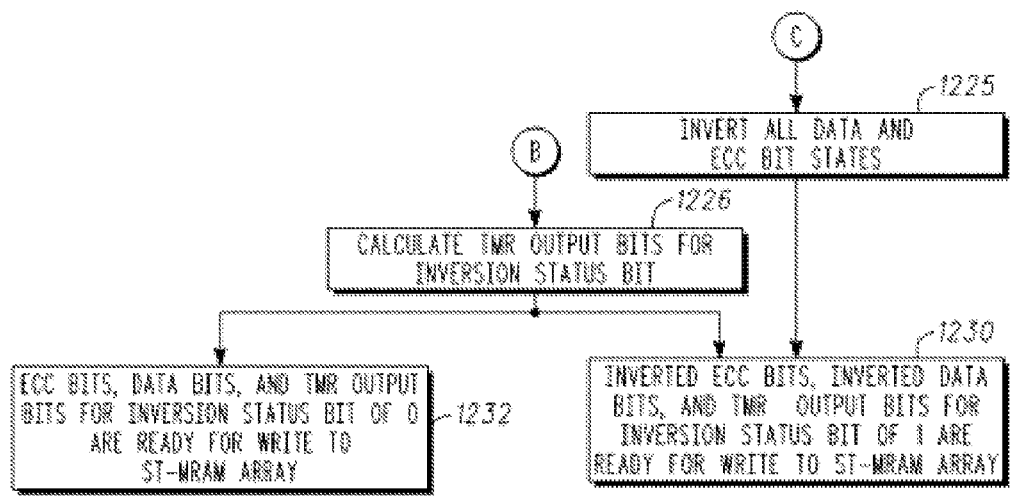
FIG. 12(b) is a flow chart of the steps occurring in response to a WRITE operation in accordance with the second exemplary embodiment.

FIG. 12 is a flow chart of the steps of process 1200 occurring in response to a WRITE operation in accordance with the second exemplary embodiment. A write operation is initiated 1202, and polling 1206 for any more WRITE operation during a programmable look-ahead delay occurs. In parallel, new data for the addressed portion of a page is received 1204. If any more WRITE operation occurs 1206 during a programmable look-ahead delay, new data from that WRITE operation is received 1204 for the addressed portion of a page. If no more WRITE operation during a programmable look-ahead delay occurs 1206, the process 1200 proceeds to step 1208. If new data is not different from non-volatile memory array data 1208, the process 1200 ends 1210. If new data is different from non-volatile memory array data 1208, parity bits are calculated 1212 using an odd number of data bits for each parity bit. Whether the majority detection circuit is active or not is determined 1214. If the majority detection circuit is active 1214, an ongoing majority detection circuit evaluation is aborted 1216, followed by determining a majority state of the data and ECC bits 1218. If 1214, majority detection circuit is not active, a majority state of the data and ECC bits is determined 1218. If 1220, the majority state is 1, an inversion status bit is set to 1 in 1222. If 1220, majority state is not 1, an inversion status bit is set 1224 to 0 following which TMR output bits for an inversion status bit of 0 are calculated 1226. Subsequent to step 1222, all the data and ECC bit states are inverted 1225, and TMR output bits are calculated 1226 for the inversion status bit of 1. Subsequent to steps 1226 and 1225, inverted ECC bits, inverted data bits, and TMR output bits for inversion status bit of 1 are ready for write to ST-MRAM array in 1230. Subsequent to steps 1226, (non-inverted) ECC bits, (non-inverted) data bits, and TMR output bits for inversion status bit of 0 are ready for write to ST-MRAM array in 1232. Note that in the process 1200, ECC bits are calculated using an odd number of data bits for each parity, the majority detection includes both data and ECC bits, and both data and ECC bits can be inverted or non-inverted for writes to the ST-MRAM array. The process 1200 in response to a WRITE operation is in accordance with the second embodiment of datapath operations in FIG. 6 and FIG. 7 during read. The process 1200 prepares data and ECC bits for write to the ST-MRAM array. The actual write operations using write current pulses to the ST-MRAM array may occur subsequently or during a PRECHARGE operation.

It is possible to perform an ACTIVATE operation, during which ST-MRAM memory array is read according to the first (FIG. 4 and FIG. 5) or second (FIG. 6 and FIG. 7) embodiments of read operations, and a PRECHARGE operation without any WRITE operation to the local data-store latches between them. When no WRITE operation is performed to the local data-store latches, during the PRECHARGE operation, the data states or an inversion of the data states stored in the data-store latches are written back to the ST-MRAM array using write current pulses if the inversion status bit is 0 or 1, respectively, in accordance with either one of the first (FIG. 4 and FIG. 5) or second (FIG. 6 and FIG. 7) embodiments. In accordance with the first (FIG. 4 and FIG. 5) embodiment, where parity calculation includes using an even number of data bits for each parity bit, stored ECC states in the data-store latches are written back to the ST-MRAM array using write current pulses. In accordance with the second (FIG. 6 and FIG. 7) embodiment, where parity calculation includes using an odd number of data bits for each parity bit, stored ECC states in the data-store latches are inverted or non-inverted prior to writing back to the ST-MRAM array depending on the inversion status bit. The stored ECC states or an inversion of the stored ECC states are written back to the ST-MRAM array using write current pulses if the inversion status bit is 0 or 1, respectively.

While more than one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method comprising:
    calculating Error Correction Code (ECC) bits associated with a memory array using an even number of data bits of a plurality of data bits;
    inverting the plurality of data bits to provide a plurality of inverted data bits;
    calculating at least one parity bit using a first set of data bits of a stored plurality of data bits, the first set of data bits having an even number of data bits;
    detecting at least one error in the plurality of inverted data bits based at least in part on a comparison of the at least one parity bit and stored ECC bits;
    generating corrected ECC bits using the at least one parity bit and the stored ECC bits;
    generating a plurality of corrected data bits; and
    inverting the plurality of corrected data bits based at least in part on a state off an inversion status bit.

2. The method of claim 1, further comprising:
    determining a majority state associated with the plurality of data bits; and
    wherein inverting the plurality of data bits is based at least in part on the majority state of the plurality of data bits.

3. The method of claim 2, wherein the inversion status bit comprises at least three inversion status bits, and the method further comprises:
    applying triple modular redundancy to determine a state of a single inversion state bit;

setting the state of the each of the at least three inversion status bits to the state of the single inversion state bit; and storing the at least three inversion status bits in the memory array.

4. The method of claim 1, further comprising:

calculating a second parity bit using a second set of data bits of the stored plurality of data bits, the second set of data bits differing from the first set of data bits and having an even number of data bits.

5. The method of claim 1, further comprising:

reading the stored plurality of inverted data bits and the stored plurality of ECC bits from the memory array prior to calculating the at least one parity bit.

6. The method of claim 1, further comprising:

setting the inversion status bit;

storing the ECC bits and the inversion status bit in the memory array;

storing the plurality of inverted data bits in the memory array; and reading the stored plurality of inverted data bits, the ECC bits, and the stored inversion status bit from the memory array prior to calculating the at least one parity bit.

7. A method comprising:

determining a plurality of Error Correction Code (ECC) bits associated with a memory array, individual ones of the ECC bits calculated using an odd number of data bits of the plurality of data bits;

inverting the plurality of data bits and the ECC bits;

calculating at least one parity bit using a first set of data bits of a stored plurality of inverted data bits, the first set of data bits having an odd number of data bits;

detecting at least one error in the plurality of inverted data bits based at least in part on a comparison of the at least one parity bit and the plurality of inverted ECC bits;

generating a plurality of corrected ECC bits;

generating a plurality of corrected data bits; and inverting the plurality of corrected data bits based at least in part on a state of an inversion status bit.

8. The method of claim 7, further comprising:

determining a majority state associated with the plurality of data bits; and wherein inverting the plurality of data bits is based at least in part on the majority state of the plurality of data bits.

9. The method of claim 7, further comprising:

setting the inversion status bit;

storing the inversion status bit in the memory array;

storing the plurality of inverted data bits in the memory array;

storing the plurality of inverted ECC bits in the memory array; and reading the stored plurality of inverted data bits, the stored plurality of inverted ECC bits, and the stored inversion status bit from the memory array prior to calculating the at least one parity bit.

10. The method of claim 7, further comprising:

calculating a second parity bit using a second set of data bits of the stored plurality of data bits, the second set of data bits differing from the first set of data bits and having an odd number of data bits.

11. An integrated circuit comprising:

a memory array; and circuitry configured to:

calculate error correction code (ECC) bits using an even number of data bits of a plurality of data bits;

invert the plurality of data bits to provide a plurality of inverted data bits;

calculate at least one parity bit using an even number of inverted data bits of the plurality of inverted data bits;

detect at least one error in the plurality of inverted data bits based at least in part on a comparison of the at least one parity bit and at least one of the plurality of ECC bits;

generate a plurality of corrected data bits and corrected ECC bits using the at least one parity bit; and invert the plurality of corrected data bits based at least in part on an inversion status bit.

12. The integrated circuit of claim 11, wherein the circuitry is further configured to:

set a state associated with the inversion status bit based at least in part on a majority state of the plurality of data bits; and store the inversion status bit in the memory array.

13. The integrated circuit of claim 11, wherein the circuitry is configured to:

store the ECC bits in the memory array prior to calculating the at least one parity bit; and store the plurality of inverted data bits in the memory array prior to calculating the at least one parity bit.

14. The integrated circuit of claim 11, wherein the circuitry is configured to provide the plurality of corrected data bits to a cache after inverting the plurality of corrected data bits.

15. An integrated circuit comprising:

a memory array; and circuitry configured to:

calculate error correction code (ECC) bits using an odd number of data bits of a plurality of data bits;

invert the plurality of data bits to provide a plurality of inverted data bits;

invert the ECC bits to provide inverted ECC bits;

setting an inversion status bit calculate at least one parity bit using an odd number of data bits of the plurality of inverted data bits;

detect at least one error in the plurality of inverted data bits based at least in part on a comparison of the at least one parity bit and at least one of the inverted ECC bits; and generate a plurality of corrected data bits and corrected ECC bits using the at least one parity bit.

16. The integrated circuit of claim 15, wherein the circuitry is configured to provide the plurality of corrected data bits to a cache.

17. The integrated circuit of claim 15, wherein the circuitry is configured to invert the plurality of data bits based on a majority state associated with the plurality of data bits.

18. The integrated circuit of claim 15, wherein the circuitry is configured to:

store the inverted data bits in the memory array prior to calculating the at least one parity bit; and store the inverted ECC bits in the memory array prior to calculating the at least one parity bit.

19. The integrated circuit of claim 15, wherein the circuitry is configured to read the stored plurality of inverted data bits and the inverted ECC bits from the memory array prior to calculating the at least one parity bit.

20. The integrated circuit of claim 15, wherein the integrated circuit is configured to determine a majority state associated with the plurality of data bits prior to inverting the plurality of data bits.

* * * * *